(12) United States Patent
Farrell et al.

(10) Patent No.: US 12,196,973 B2
(45) Date of Patent: Jan. 14, 2025

(54) SHOCK ABSORBERS IN AN OPTICAL ASSEMBLY FOR A WEARABLE DISPLAY DEVICE

(71) Applicant: Meta Platforms Technologies, LLC, Menlo Park, CA (US)

(72) Inventors: Richard Farrell, Seattle, WA (US); Michiel Koen Callens, Mountain View, CA (US); Yu Shi, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 146 days.

(21) Appl. No.: 17/890,001

(22) Filed: Aug. 17, 2022

(65) Prior Publication Data

US 2024/0019703 A1   Jan. 18, 2024

Related U.S. Application Data

(60) Provisional application No. 63/388,575, filed on Jul. 12, 2022.

(51) Int. Cl.
*G02B 27/01* (2006.01)
*F16F 15/04* (2006.01)
(Continued)

(52) U.S. Cl.
CPC .......... *G02B 27/0176* (2013.01); *F16F 15/04* (2013.01); *G02B 6/0093* (2013.01);
(Continued)

(58) Field of Classification Search
CPC ............ G02B 27/0176; G02B 27/0172; G02B 6/0093; G02B 2027/0161;
(Continued)

(56) References Cited

U.S. PATENT DOCUMENTS 10,529,063 B2   1/2020   Rodriguez et al.
10,678,059 B1*  6/2020   Sirimamilla ....... G02B 27/0172
(Continued)

OTHER PUBLICATIONS

Clemson S.C., "Nano Shock Absorbers," Photonics.com, Aug. 15, 2008, 3 pages, Retrieved from the Internet: URL: https://www.photonics.com/Articles/Nano_Shock_Absorbers/a34897.
(Continued)

*Primary Examiner* — Jerry M Blevins
(74) *Attorney, Agent, or Firm* — Mannava & Kang, P.C.

(57) ABSTRACT

An optical assembly to be used in a head-mounted display (HMD) device or similar may include a first optical component and a second optical component, where the first optical component and the second optical component are layered in the optical assembly. The optical assembly may also include a waveguide positioned between the first optical component and the second optical component. One or more shock absorbers may be positioned on surfaces of the first optical component and the second optical component facing the waveguide. The shock absorbers may be a support that touches a surface of the waveguide or a stand-off that extends toward the waveguide with a gap. The shock absorbers may also include a pillar, a cone, an inverted cone, an inverted pillar, a spring, a double helix, a three-dimensional mesh, a strap, a bumper, a sphere, or a high aspect ratio 3D mesh tower.

20 Claims, 11 Drawing Sheets

(51) Int. Cl.
    *F21V 8/00*    (2006.01)
    *G03F 7/00*    (2006.01)
(52) U.S. Cl.
    CPC ....... *G02B 27/0172* (2013.01); *G03F 7/0005*
        (2013.01); *G02B 2027/0161* (2013.01); *G02B
        2027/0169* (2013.01); *G02B 2027/0178*
        (2013.01)
(58) Field of Classification Search
    CPC ..... G02B 2027/0169; G02B 2027/0178; F16F
        15/04; G03F 7/0005
    USPC ........................................................ 385/134
    See application file for complete search history.

(56) References Cited

U.S. PATENT DOCUMENTS

| | | | |
|---|---|---|---|
| 11,181,741 | B1 | 11/2021 | Yaroshchuk et al. |
| 11,204,501 | B2 | 12/2021 | Osterhout |

OTHER PUBLICATIONS

Yoshida T., et al., "A Plastic Holographic Waveguide Combiner for Light-Weight and Highly-Transparent Augmented Reality Glasses," Journal of the Society for Information Display, 2018, 8 pages.

* cited by examiner

SHOCK ABSORBERS IN AN OPTICAL ASSEMBLY FOR A WEARABLE DISPLAY DEVICE

CROSS REFERENCE TO RELATED APPLICATIONS

This patent application claims the benefit of U.S. Provisional Patent Application Ser. No. 63/388,575 filed on Jul. 12, 2022. The disclosures of the above application are hereby incorporated by reference for all purposes.

TECHNICAL FIELD

This patent application relates generally to augmented reality (AR) and/or virtual reality (VR) devices, and specifically, to providing shock absorbers between components of an optical assembly in augmented reality (AR) and/or virtual reality (VR) devices.

BACKGROUND

With recent advances in technology, prevalence and proliferation of content creation and delivery has increased greatly in recent years. In particular, interactive content such as virtual reality (VR) content, augmented reality (AR) content, mixed reality (MR) content, and content within and associated with a real and/or virtual environment (e.g., a "metaverse") has become appealing to consumers.

To facilitate delivery of this and other related content, service providers have endeavored to provide various forms of wearable display systems. One such example may be a head-mounted display (HMD) device, such as a wearable eyewear, a wearable headset, or eyeglasses. In some examples, the head-mounted display (HMD) device may project or direct light to display virtual objects or combine images of real objects with virtual objects, as in virtual reality (VR), augmented reality (AR), or mixed reality (MR) applications. Head-mounted display (HMD) devices may include various optical and electrical components, which may be vulnerable to impact in case of a drop, for example.

BRIEF DESCRIPTION OF DRAWINGS

Features of the present disclosure are illustrated by way of example and not limited in the following figures, in which like numerals indicate like elements. One skilled in the art will readily recognize from the following that alternative examples of the structures and methods illustrated in the figures can be employed without departing from the principles described herein.

DETAILED DESCRIPTION

For simplicity and illustrative purposes, the present application is described by referring mainly to examples thereof. In the following description, numerous specific details are set forth in order to provide a thorough understanding of the present application. It will be readily apparent, however, that the present application may be practiced without limitation to these specific details. In other instances, some methods and structures readily understood by one of ordinary skill in the art have not been described in detail so as not to unnecessarily obscure the present application. As used herein, the terms "a" and "an" are intended to denote at least one of a particular element, the term "includes" means includes but not limited to, the term "including" means including but not limited to, and the term "based on" means based at least in part on.

As used herein, a head-mounted display (HMD) device may be a wearable device that projects or directs light to display virtual objects or combine images of real objects with virtual objects. A head-mounted display (HMD) device may be a wearable eyewear, a wearable headset, or eyeglasses, for example. A "near-eye display" may refer to any display device (e.g., an optical device) that may be in close proximity to a user's eye. As used herein, "artificial reality" may refer to aspects of, among other things, a "metaverse" or an environment of real and virtual elements and may include use of technologies associated with virtual reality (VR), augmented reality (AR), and/or mixed reality (MR). As used herein, a "user" may refer to a user or wearer of a "near-eye display." As used herein a "shock absorber" refers to a nano- or micro-structure positioned between components of an optical assembly. A shock absorber may be a "support" that touches surfaces of both components it is positioned between or a "stand-off" that touches only one component's surface and has a gap with the other component's surface.

Some head-mounted display (HMD) devices may include displays, projectors, and/or various optical, electrical, and opto-electrical components to direct, filter, and/or otherwise process light. Some of the components may also be optical or electro-optical components to correct aberrations or otherwise enhance the projected light. In some implementations, some of the components may be assembled in form of an optical assembly or "an optical stack", where the components are layered with an air gap between each component and held together through spacers or adhesive. As wearable device technologies advance, smaller and lighter components may be used. With smaller size (e.g., smaller air gap between components of an optical assembly), there may be increased vulnerability to impact. For example, if a head-mounted display (HMD) device is dropped from a height or hit against an object, components in the optical assembly may touch or impact each other causing damage such as scratches or breaks.

In some examples of the present disclosure, nano- or micro-structures may be implemented as shock absorbers (stand-offs or supports) between layers (components) of an optical assembly in a head-mounted display (HMD) device, specifically between a waveguide and adjacent components. Low density, low touch stand-offs or supports may allow protection of optical assembly components while reducing air gap(s) between the components without degrading optical performance.

While some advantages and benefits of the present disclosure are apparent, other advantages and benefits may include enabling smaller form-factor optical assemblies for head-mounted display (HMD) devices without an adverse effect on reliability due to impact damage risk. Shock absorbers as discussed herein may be provided with easier manufacturing processes and reduced or minimized influence on optical performance of various components of the optical assembly.

Figure 1A:
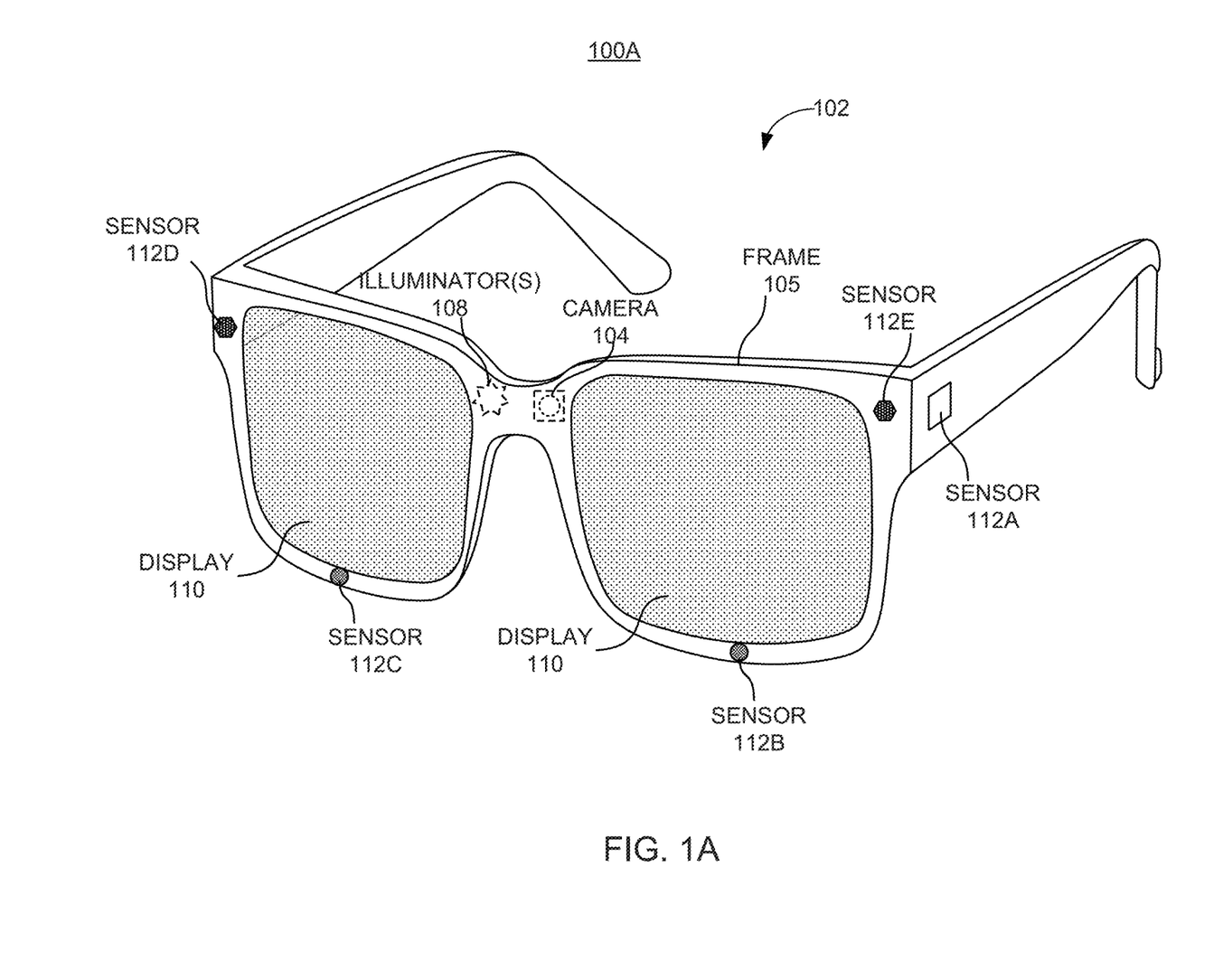
FIG. 1A illustrates a perspective view of a near-eye display in form of a pair of augmented reality (AR) glasses, according to an example.

FIG. 1A is a perspective view of a near-eye display 102 in the form of a pair of glasses (or other similar eyewear), according to an example. In some examples, the near-eye display 102 may be configured to operate as a virtual reality display, an augmented reality (AR) display, and/or a mixed reality (MR) display.

As shown in diagram 100A, the near-eye display 102 may include a frame 105 and a display 110. In some examples, the display 110 may be configured to present media or other content to a user. In some examples, the display 110 may include display electronics and/or display optics. For example, the display 110 may include a liquid crystal display (LCD) display panel, a light-emitting diode (LED) display panel, or an optical display panel (e.g., a waveguide display assembly). In some examples, the display 110 may also include any number of optical components, such as waveguides, gratings, lenses, mirrors, etc. In other examples, the display 110 may include a projector, or in place of the display 110 the near-eye display 102 may include a projector. The projector may use laser light to form an image in angular domain on an eye box for direct observation by a viewer's eye.

In some examples, the near-eye display 102 may further include various sensors 112A, 112B, 112C, 112D, and 112E on or within a frame 105. In some examples, the various sensors 112A-112E may include any number of depth sensors, motion sensors, position sensors, inertial sensors, and/or ambient light sensors, as shown. In some examples, the various sensors 112A-112E may include any number of image sensors configured to generate image data representing different fields of views in one or more different directions. In some examples, the various sensors 112A-112E may be used as input devices to control or influence the displayed content of the near-eye display, and/or to provide an interactive virtual reality (VR), augmented reality (AR), and/or mixed reality (MR) experience to a user of the near-eye display 102. In some examples, the various sensors 112A-112E may also be used for stereoscopic imaging or other similar application.

In some examples, the near-eye display 102 may further include one or more illuminators 108 to project light into a physical environment. The projected light may be associated with different frequency bands (e.g., visible light, infra-red light, ultra-violet light, etc.), and may serve various purposes. In some examples, the one or more illuminator(s) 108 may be used as locators.

In some examples, the near-eye display 102 may also include a camera 104 or other image capture unit. The camera 104, for instance, may capture images of the physical environment in the field of view. In some instances, the captured images may be processed, for example, by a virtual reality engine to add virtual objects to the captured images or modify physical objects in the captured images, and the processed images may be displayed to the user by the display 110 for augmented reality (AR) and/or mixed reality (MR) applications.

In some examples, the near-eye display 102 may include an optical assembly with optical, electrical, and/or opto-electrical components to direct, filter, and/or otherwise process light. Some of the components may also be optical or electro-optical components to correct aberrations, provide prescription correction, or otherwise enhance a projected image. Components of the optical assembly may have a relatively small airgap between them and be, therefore, subject to impact damage in cases of drops or hits.

Figure 1B:
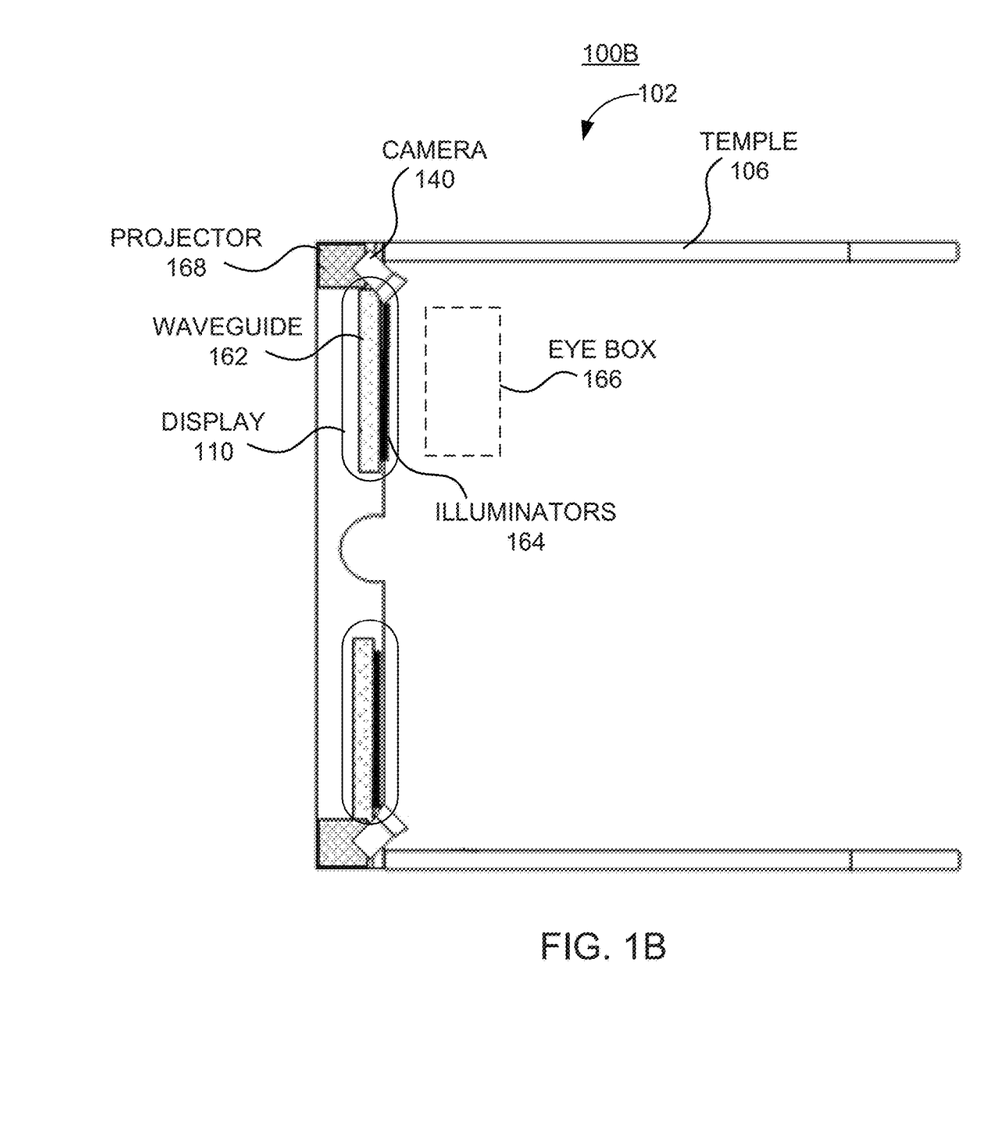
FIG. 1B illustrates a top view of a near-eye display in form of a pair of augmented reality (AR) glasses, according to an example.

FIG. 1B is a top view of a near-eye display 102 in the form of a pair of glasses (or other similar eyewear), according to an example. As shown in diagram 100B, the near-eye display 102 may include a frame 105 having a form factor of a pair of eyeglasses. The frame 105 supports, for each eye: a projector 168 such as any projector variant considered herein, a pupil-replicating waveguide 162 optically coupled to the projector 168, an eye-tracking camera 140, and a plurality of illuminators 164. The illuminators 164 may be supported by the pupil-replicating waveguide 162 for illuminating an eye box 166. The projector 168 may provide a fan of light beams carrying an image in angular domain to be projected into a user's eye.

The eye-tracking camera 140 may be used to determine position and/or orientation of both eyes of the user. Once the position and orientation of the user's eyes are known, a gaze convergence distance and direction may be determined. The imagery displayed by the projector 168 may be adjusted dynamically to account for the user's gaze, for a better fidelity of immersion of the user into the displayed augmented reality scenery, and/or to provide specific functions of interaction with the augmented reality. In operation, the illuminators 164 may illuminate the eyes at the corresponding eye boxes 166, to enable the eye-tracking cameras to obtain the images of the eyes, as well as to provide reference reflections. The reflections (also referred to as "glints") may function as reference points in the captured eye image, facilitating the eye gazing direction determination by determining position of the eye pupil images relative to the glints. To avoid distracting the user with illuminating light, the latter may be made invisible to the user. For example, infrared light may be used to illuminate the eye boxes 166.

In some examples, an optical assembly, as described herein, may be used in conjunction with the display 110 or projector 168. For example, the Display 110 may include a "stack" of optical, electrical, and opto-electrical components including the waveguide 162 to direct, focus, filter, and/or otherwise process light. In smaller form-factor head-mounted display (HMD) devices such as the near-eye display device 102, a drop of the device by a user or a hit against a hard object may cause movement among the components of the optical assembly resulting in surfaces of the components touching each other and causing scratch or break on other components. Shock absorbers such as supports or stand-offs as described herein may prevent such damage while allowing smaller airgaps.

In some examples, the image processing and eye position/orientation determination functions may be performed by a central controller, not shown, of the near-eye display 102. The central controller may also provide control signals to the projectors 168 to generate the images to be displayed to the user, depending on the determined eye positions, eye orientations, gaze directions, eyes vergence, etc.

Functions described herein may be distributed among components of the near-eye display 102 in a different manner than is described here. Furthermore, a near-eye display as discussed herein may be implemented with additional or fewer components than shown in FIGS. 1A and 1B. While the near-eye display 102 is shown and described in form of glasses, shock absorbers and supports between components of optical stacks in augmented reality (AR), virtual reality (VR) devices may be implemented in other forms of near-eye displays such as goggles or headsets, as well as in non-wearable display systems.

Figure 2A:
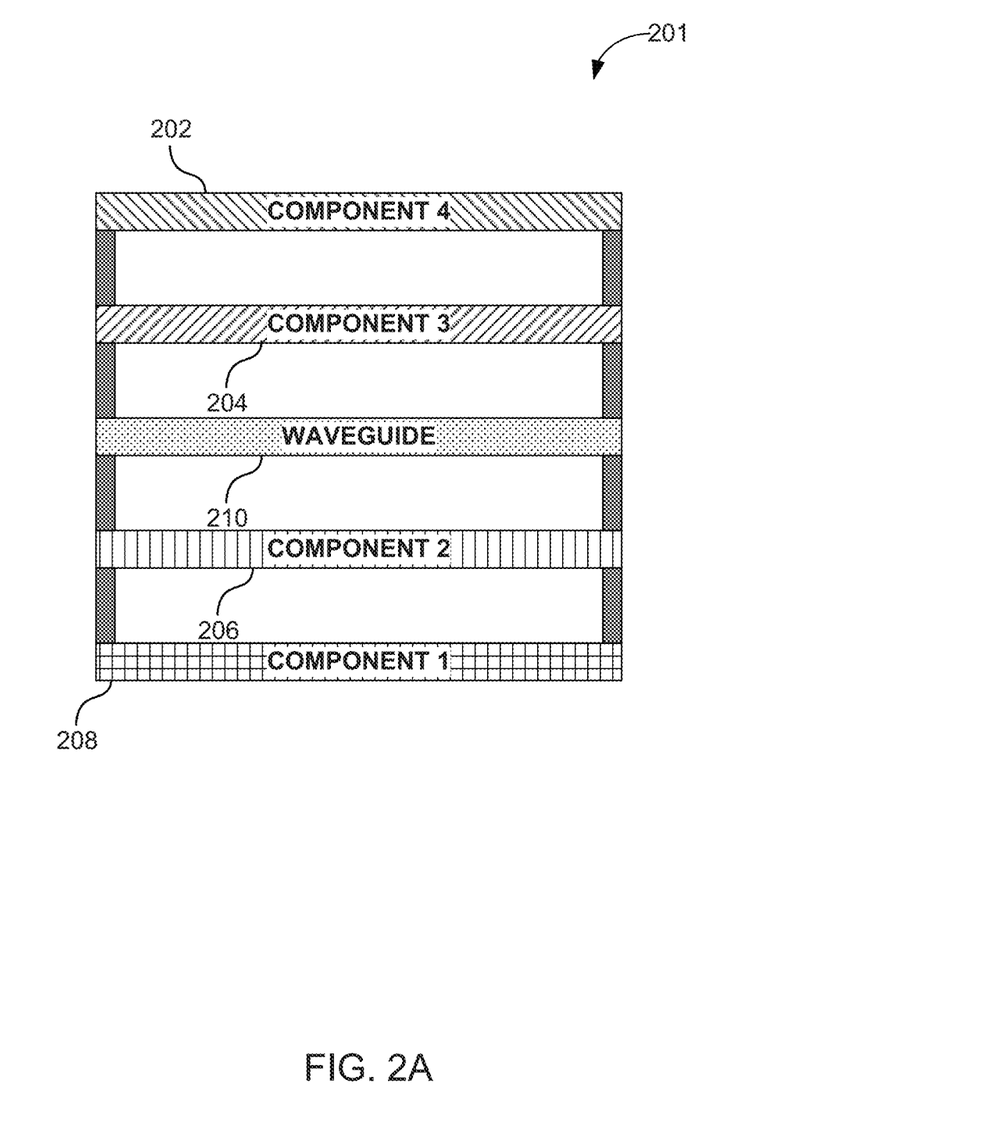
FIG. 2A illustrates a side view of an optical assembly with a waveguide and four other example components, according to an example.

FIG. 2A illustrates a side view of an optical assembly 201 with a waveguide and four other example components, according to an example. The optical assembly 201 may include example components: component 1 208, component 2 206, component 3 204, and component 4 202. The waveguide 210 may be positioned between the component 2 206 and the component 3 204. The components (and the waveguide 210) may be affixed together through spacers or an adhesive along their perimeters.

In some examples, the example components may be optical, electrical, or opto-electrical components and include, for example, a free-form phase plate, a zoom focus lens, a liquid lens, a metalens, a light field lens, a solid optical lens, a microlens array, a diffractive or a transparent display, or comparable components. The example components may perform functions such as focusing light, correcting aberrations, polarizing light, local dimming, prescription correction, adjusting optical power, providing content (in case of transparent display), etc.

In some examples, the components (and the waveguide 210) may have an air gap between them. As wearable device technologies advance, smaller and lighter components may be used. One of the approaches to decrease size may be shrinking the air gap between components of the optical assembly 201. However, with smaller air gap, there may be increased vulnerability to impact. For example, if a head-mounted display (HMD) device containing the optical assembly 201 is dropped from a height or hit against an object, components in the optical assembly may touch or impact each other causing damage such as scratches or breaks.

Some optical assemblies may employ mitigation techniques such as adding weight to individual components and making them stiffer, which is against a goal of making head-mounted display (HMD) devices and their components lighter. An alternative approach of larger air gap(s) is also against the goal of making head-mounted display (HMD) devices and their components smaller. Another mitigation implementation may be random placement of polymer beads between components (on component surfaces). However, polymer beads may be difficult to scale for head-mounted display (HMD) devices and they may degrade optical performance.

Figure 2B:
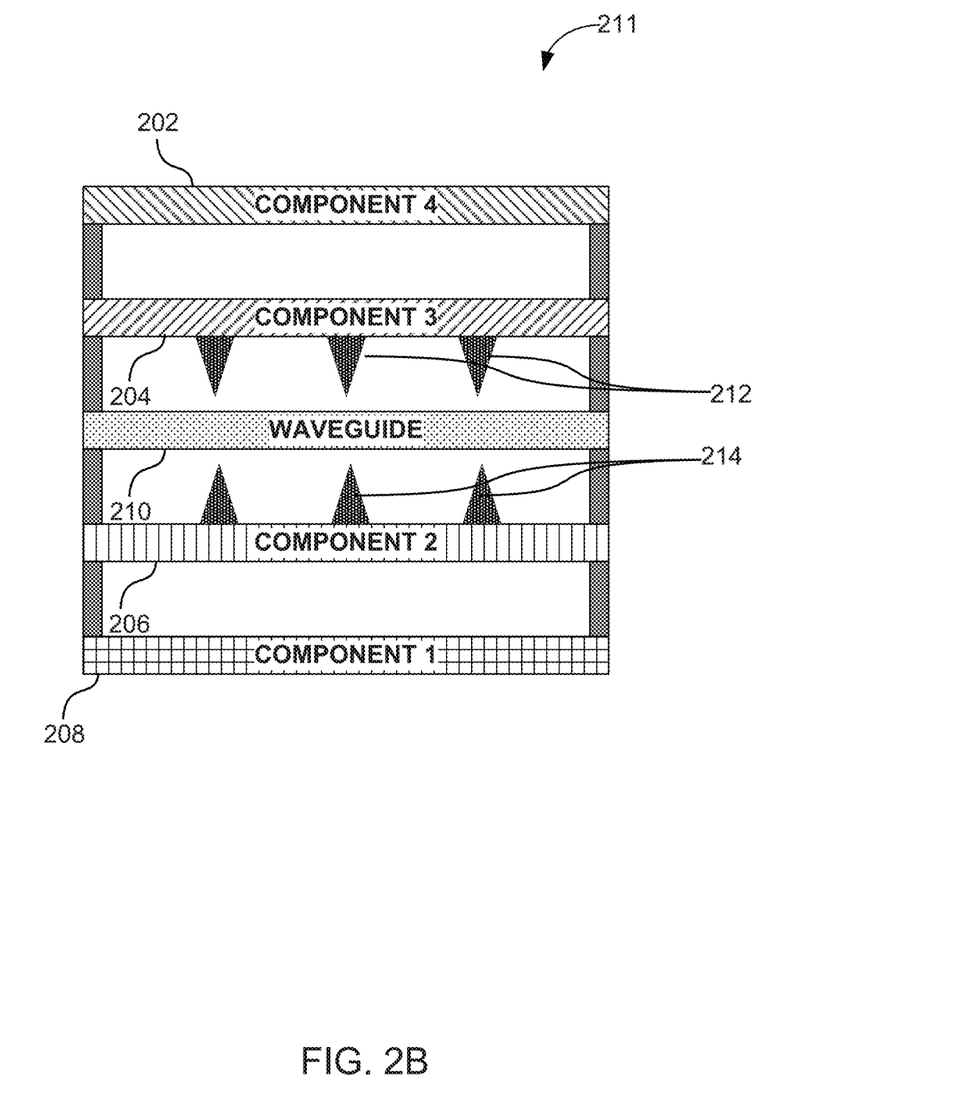
FIGS. 2B through 2D illustrate side views of optical assemblies with example configurations of shock absorbers, according to an example.
Figure 2C:
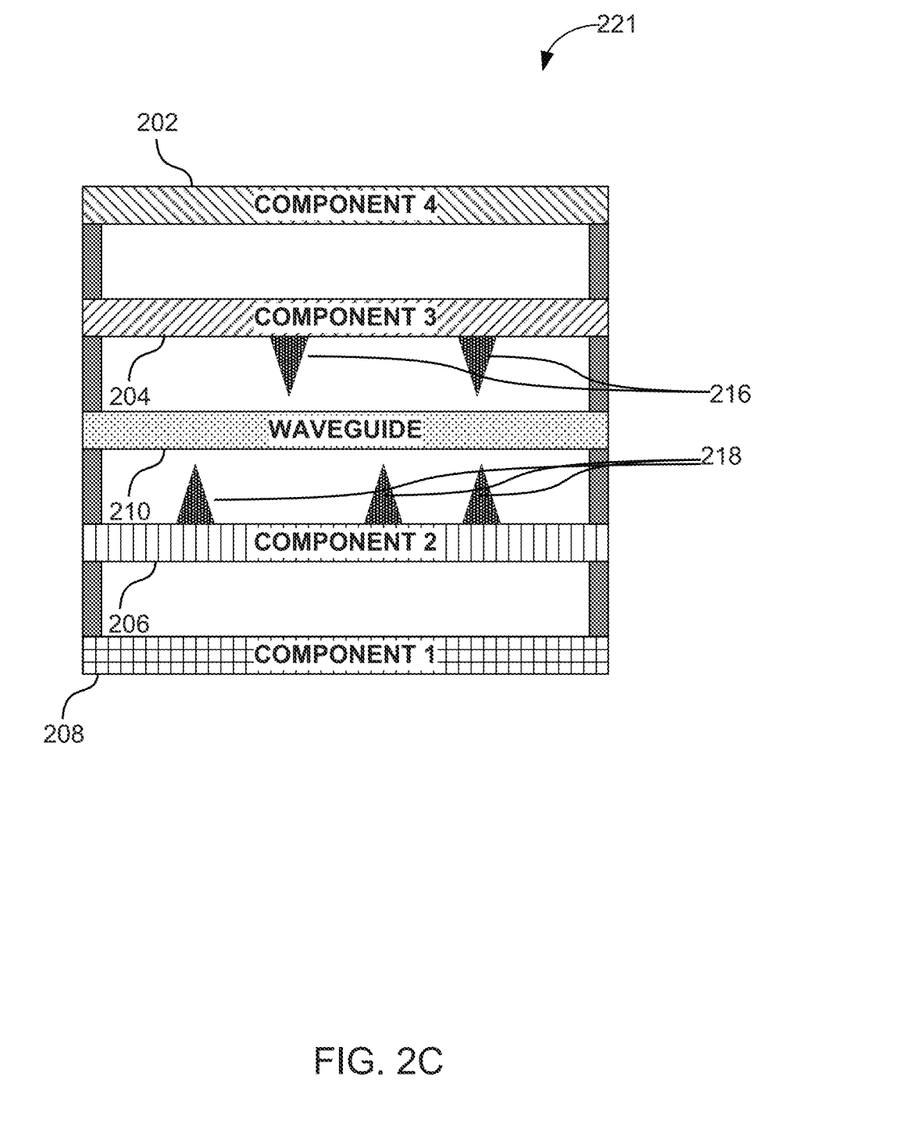
Figure 2D:
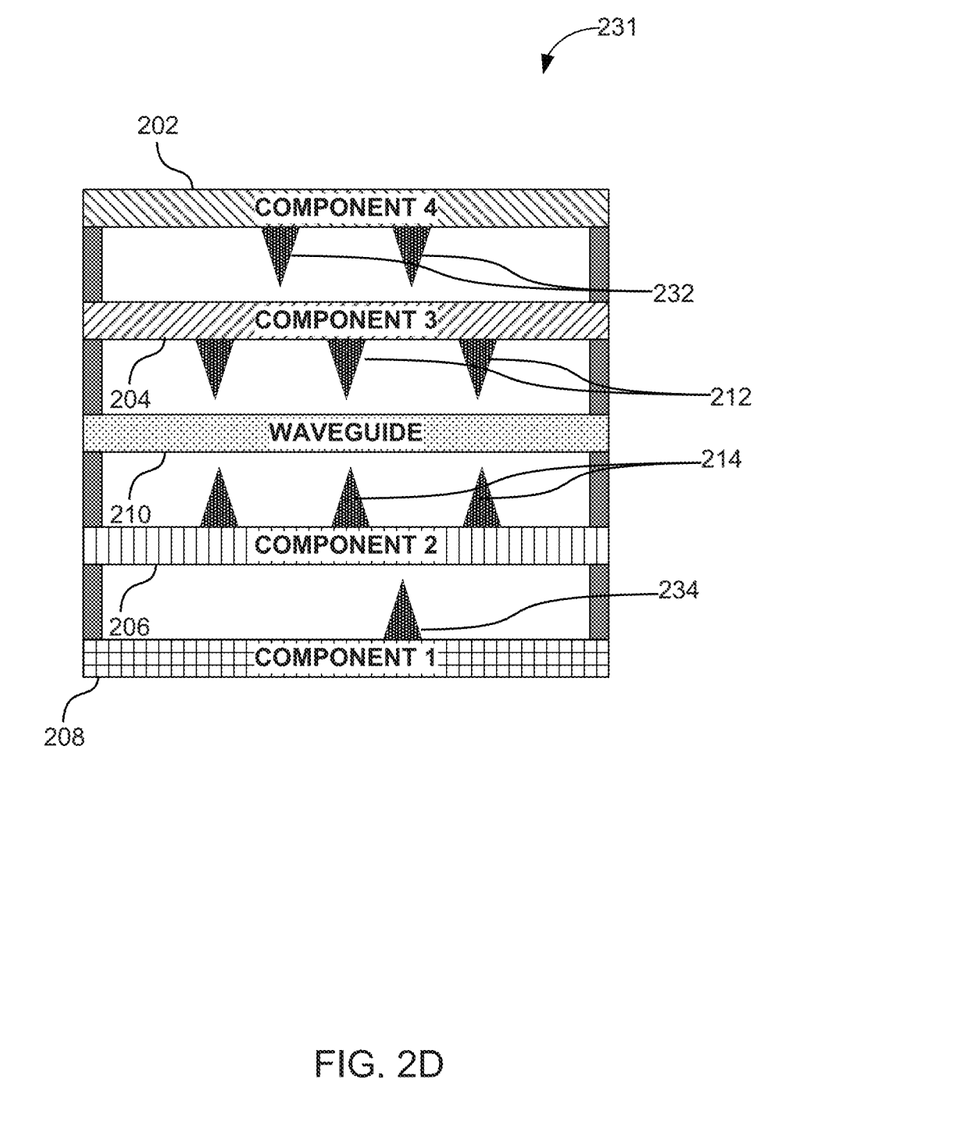

FIGS. 2B through 2D illustrate side views of optical stacks with example configurations of stand-offs, according to an example. FIG. 2B shows optical assembly 211 with stand-off type shock absorbers 212 on a surface of the component 3 204 facing the waveguide 210 and stand-off type shock absorbers 214 on a surface of the component 1 206 facing the waveguide 210 in an opposite direction. The shock absorbers 212 and 214 do not touch surfaces of the waveguide 210 in a normal state, but in case of an impact, they may prevent either component 2 206 or component 3 204 from touching the surfaces of the waveguide 210 and, thereby causing damage such as scratches or breaks. In some examples, as shown in FIG. 2B, the shock absorbers 212 and 214 may be distributed across the surfaces of the components 2 206 and 3 204 according to a predefined pattern (e.g., with substantially equal distances between the shock absorbers).

FIG. 2C shows optical assembly 221 with stand-off type shock absorbers 216 on a surface of the component 3 204 facing the waveguide 210 and stand-off type shock absorbers 218 on a surface of the component 1 206 facing the waveguide 210 in an opposite direction. As in FIG. 2B, the shock absorbers 216 and 218 do not touch surfaces of the waveguide 210 in a normal state, but in case of an impact, they may prevent either component 2 206 or component 3 204 from touching the surfaces of the waveguide 210 and, thereby causing damage such as scratches or breaks. In some examples, as shown in FIG. 2C, the shock absorbers 216 and 218 may be distributed across the surfaces of the components 2 206 and 3 204 randomly.

FIG. 2D shows the optical assembly 231 with stand-off type shock absorbers 212 on a surface of the component 3 204 facing the waveguide 210 and stand-off type shock absorbers 214 on a surface of the component 1 206 facing the waveguide 210 in an opposite direction. While the waveguide 210 may be the most vulnerable and critical component to be protected, in some examples, shock absorbers may also be used between other components of the optical assembly 231 to protect additional components of the optical assembly 231. For example, shock absorbers 232 may be positioned on a surface of the component 4 202 facing the component 3 204 (and protecting it against impact). Similarly, shock absorber 234 may be positioned on a surface of the component 1 208 facing the component 2 206 (and protecting it against impact). As in FIGS. 2B and 2C, the shock absorbers 232 and 234 may be distributed according to a predefined pattern or randomly across the surfaces of the respective components.

In some examples, a height of the shock absorbers may be in a range from 1 micrometer to 300 micrometers. While the shock absorbers (stand-offs) in FIGS. 2B-2D are shown to have conical shapes, other shapes, as discussed in conjunction with FIG. 6 below, may also be used. A base diameter of the shock absorbers may be in a range from 1 micrometer to 300 micrometers. A gap between a tip of a shock absorber and the corresponding surface of the waveguide (or another protected component) may be 2 micrometers or more in some cases to avoid interference with an optical performance of the waveguide (or the other protected component).

Figure 3:
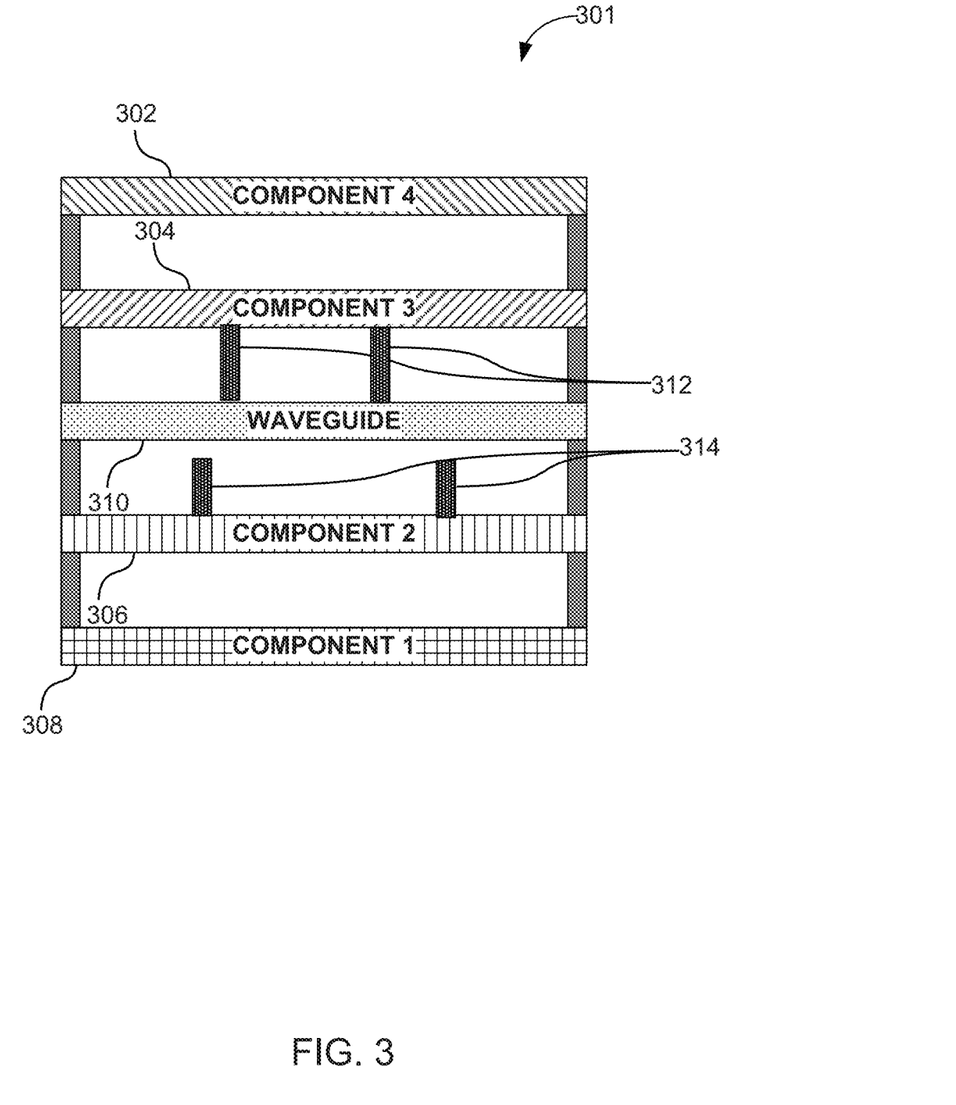
FIG. 3 illustrates a side view of an optical assembly with an example configuration of supports and stand-offs, according to an example.

FIG. 3 illustrates a side view of an optical stack 301 with an example configuration of supports and stand-offs, according to an example. As shown in FIG. 3, the optical stack 301 may include component 1 308, component 2 306, component 3 304, and component 4 302 for performing various optical functions discussed herein. The waveguide 310 may be positioned between the component 2 306 and the component 3 304. The components (and the waveguide 310) may be affixed together through spacers or an adhesive along their perimeters.

In some examples, the waveguide 310 may be protected against impact damage by adjacent components through supports 312, which may be positioned on a surface of the component 3 304 facing the waveguide 310. The supports 312 may touch opposing surfaces of the component 3 304 and the waveguide 310 in a normal state. While touching the waveguide may interfere with its display performance to a degree, by selecting a base size and the number of the supports 312 appropriately, the interference may be reduced or minimized.

Optical assembly 301 is also shown with stand-offs 314 on a surface of the component 2 306 facing the waveguide 310. The stand-offs 314, similar to the shock absorbers in FIGS. 2B-2D, may have gap of at least 2 micrometers from a surface of the waveguide 310 avoiding any interference with an optical performance of the waveguide 310. When light totally internally reflects at a boundary, the evanescent wave has a particular penetration depth into a low index medium. If the evanescent wave is disturbed, the total internal reflection may not be perfect. Thus, the gap between the shock absorber and a surface of the waveguide may be selected to be a at least twice the wavelength of the light beam to prevent interference with the waveguide. A gap of at least 2 micrometers may prevent this effect from occurring with a safety margin. As shown in FIG. 3, both types of shock absorbers may be used in combination in some example optical assemblies.

Figure 4:
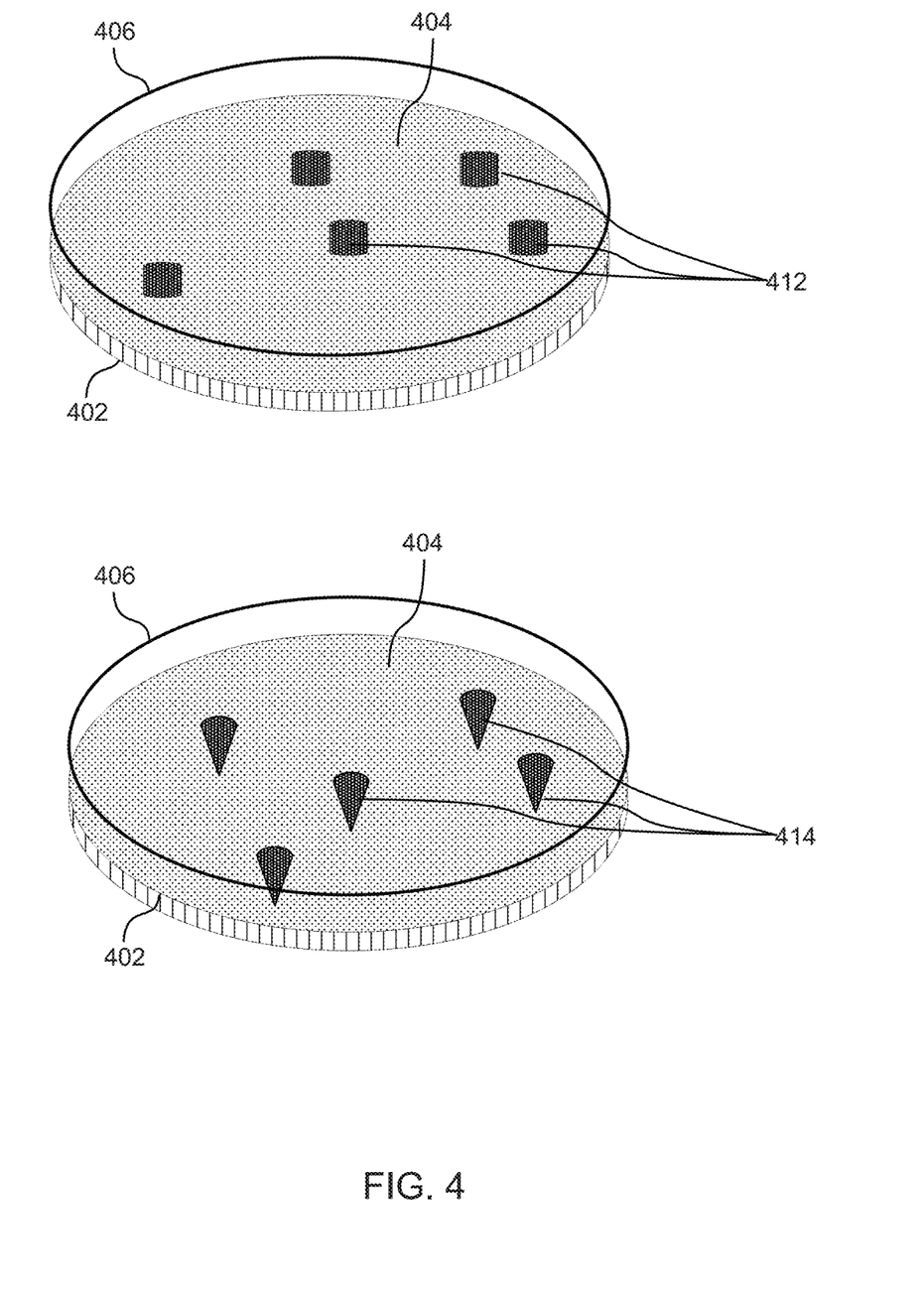
FIG. 4 illustrates perspective, see-through views of stacked optical components with various stand-offs, according to an example.

FIG. 4 illustrates perspective, see-through views of stacked optical components with various stand-offs, according to an example. In some examples, the stacked optical components may include a waveguide 402 and an optical component 406 with an airgap between the optical component 406 and the waveguide 402. As shown in FIG. 4, stand-offs 412 or stand-offs 414 may be formed on a bottom surface of the optical component facing a top surface 404 of the waveguide 402. In some implementations, the stand-offs (e.g., stand-offs 412) may be in cylindrical or straight prism form, where a base profile of the stand-offs may be substantially similar (in size and/or shape) to a tip profile. In other examples, the stand-offs (e.g., stand-offs 414), may be in conical form such as a cone or a rectangular/triangular prism, where the base profile is larger than a tip profile. As shown in the figure, the stand-offs may be distributed across a surface of the optical component 406 randomly.

In some examples, surfaces of the components of an optical assembly may be flat. In other examples, surfaces of the components may have a spherical curvature, a cylindrical curvature, or similar profiles. Thus, a distribution of the shock absorbers (supports or stand-offs) may be determined based on a surface profile of a component, a surface area of the component, and an airgap between the components.

Figure 5:
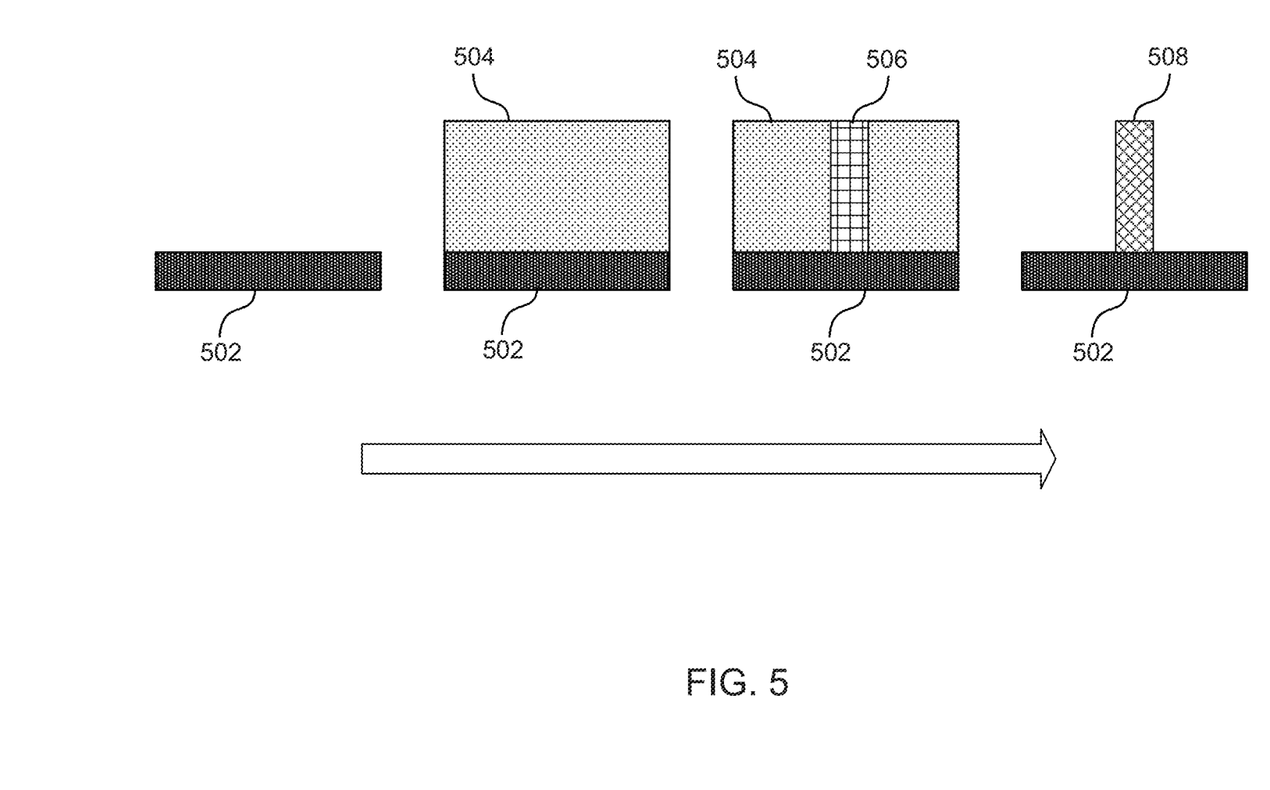
FIG. 5 illustrates a process flow for fabrication of a shock absorber, according to an example.

FIG. 5 illustrates a process flow for fabrication of a stand-off, according to an example. As shown in FIG. 5, a fabrication process may begin with a substrate 502, onto which a negative (or positive) photoresist material 504 may be deposited. Through lithography (e.g., two-photon lithography, nano-imprint, projection lithography) a designated structure (shock absorber) 506 may be formed within the photoresist material 504. Once the remaining photoresist material 504 is removed, the simple or complex shock absorber structure 508 may remain.

While conventional lithography techniques on the sub-micrometer scale have been limited to planar objects, other lithography techniques such as nano-imprint or projection lithography may provide simple cone or pillar structures. Another example technique, two-photon polymerization enables three-dimensional fabrication in the 100 nm scales. Thus, miniaturized arbitrary three-dimensional structures with resolution beyond the diffraction limit of light may be fabricated. Similar to standard photolithography techniques, structuring in two-photon lithography is accomplished by illuminating negative-tone or positive-tone photoresists with light of a well-defined wavelength. A fundamental difference is, however, the avoidance of scaffolds. Instead, two-photon absorption is utilized to induce a change in the solubility of the photoresist polymer for appropriate developers. To achieve sub-micron structures, femtosecond laser pulses may be provided in the process.

Two-photon polymerization is a non-linear optical process based on the simultaneous absorption of two photons in a photosensitive (photoresist) material. The exposure process changes the photosensitive material, that is, it leads to a polymerization by activating photo-initiators in the photoresist material. The photo-initiators generate radicals that polymerize the photoresist material locally. In a subsequent step, the non-polymerized photoresist may be removed to uncover the structure. The material of the structures may not be restricted to polymers but may be converted, for example, into silicon in a secondary chemical process.

Figure 6:
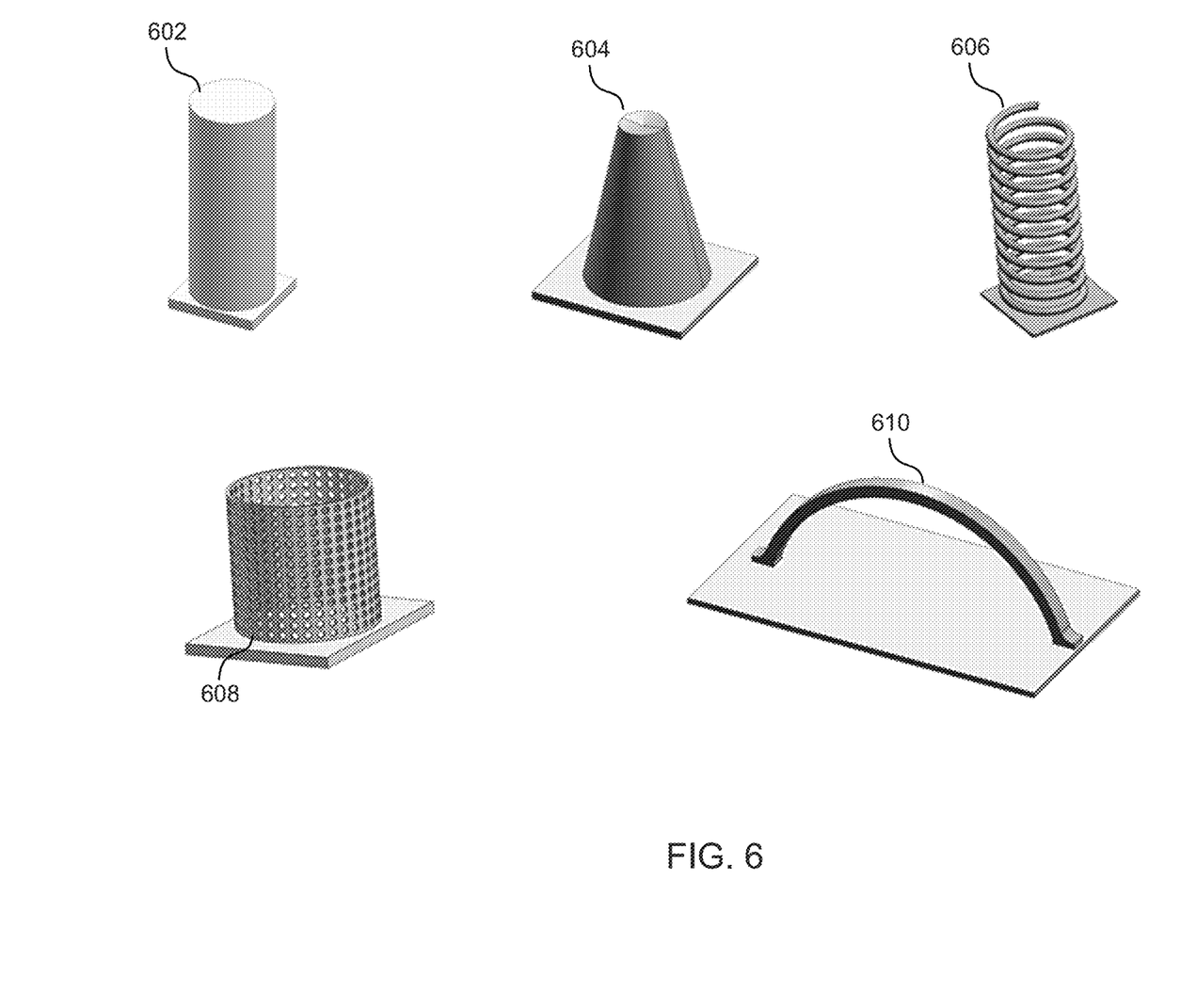
FIG. 6 illustrates example shock absorbers that may be used in an optical assembly, according to some examples.

FIG. 6 illustrates example stand-offs (or supports) that may be used in an optical stack, according to some examples. While conical or cylindrical shock absorbers are shown in example configurations of FIGS. 2B-2D, 3, and 4, a wide variety of shock absorber forms may be employed to protect components of optical assemblies against impact. Example shock absorber forms may include, but are not limited to, a pillar, a cone, an inverted cone, an inverted pillar, a spring, a double helix, a three-dimensional mesh, a strap, a high aspect ratio tower, or a cylinder. FIG. 6 shows some of the example shock absorber forms such as pillar 602, a cone 604, a spring 606, a mesh cylinder 608, and a bumper 610. Other shock absorbers forms such as a bumper, a sphere, or comparable ones may also be used. As mentioned herein, a base diameter of these example structures may be in a range between 1 micrometer and 300 micrometers. Similarly, their height may also be in a range between 1 micrometer and 300 micrometers. In some cases, like the pillar 602, mesh cylinder 608, etc. the beam diameter may be in a range between 10 micrometers and 90 micrometers In some examples, the shock absorbers may be made from polymers, silicon dioxide, inorganic-organic hybrids, or similar low refractive index material. The shock absorbers may be fabricated on a surface of a component adjacent to the waveguide in the optical assembly through two-photon lithography or similar techniques. The refractive index for the shock absorber material may be selected in a range from 1.1 to 1.7. Other characteristics for the shock absorber material may include, but are not limited to, mechanical stability (e.g., withstand shear, adhesion, and compressive forces).

Figure 7:
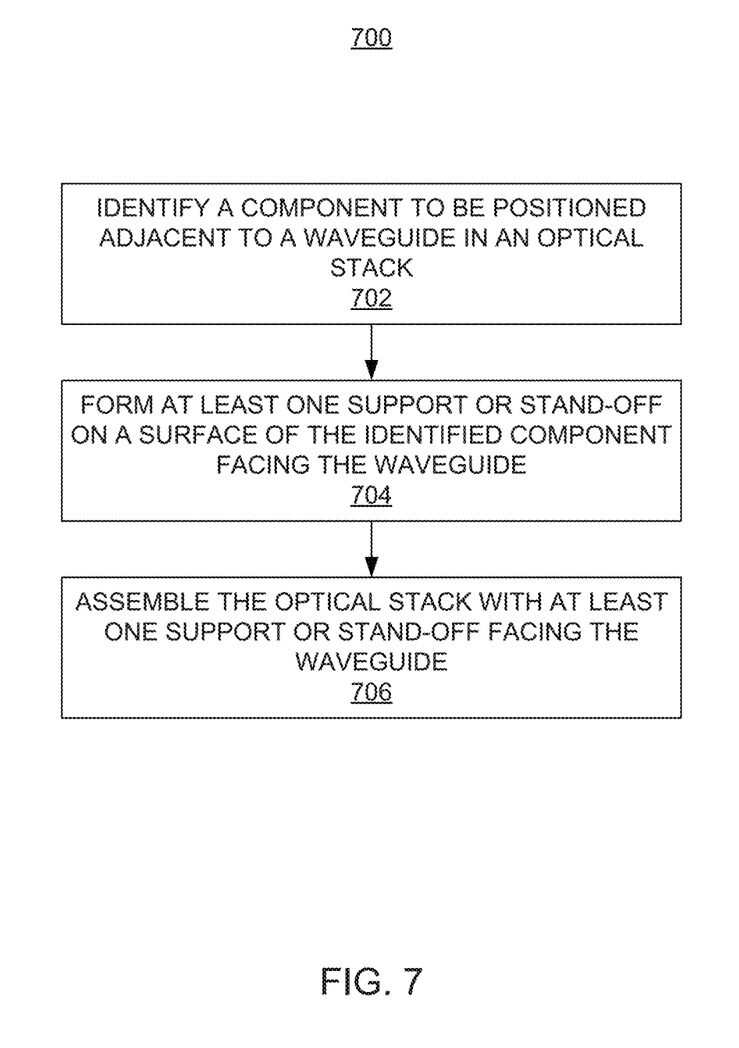
FIG. 7 illustrates a flowchart of a method for assembling an optical assembly with shock absorbers, according to an example.

FIG. 7 illustrates a flowchart of a method for assembling an optical stack with stand-offs, according to an example. The method 700 is provided by way of example, as there may be a variety of ways to carry out the method described herein. Although the method 700 is primarily described as being performed to implement the models of FIG. 2A through 4, the method 700 may be executed or otherwise performed by one or more processing components of another system or a combination of systems to implement other models. Each block shown in FIG. 7 may further represent one or more processes, methods, or subroutines, and one or more of the blocks may include machine readable instructions stored on a non-transitory computer readable medium and executed by a processor or other type of processing circuit to perform one or more operations described herein.

At block 702, a component (e.g., component 2 306) to be positioned adjacent to a waveguide (e.g., waveguide 310) in an optical assembly (with an airgap between the component and the waveguide) may be identified. At block 704, one or more shock absorbers (supports 312 and/or stand-offs 314)

may be formed on a surface of the identified component facing the waveguide 310. The one or more shock absorbers may be distributed across the surface of the component according to a predefined pattern or randomly to minimize touching of optical layers. The shock absorbers may be in various forms and sizes based on a surface area of the components, an airgap between the component and the waveguide, and materials of the component and the waveguide.

At block 706, the optical assembly (various components) may be put together with the components including the waveguide held together through spacers or an adhesive along the perimeter of each component. Shock absorbers on one or either side of the waveguide (and/or between other components) may protect those components against impact in case of drop or hit of a head-mounted display (HMD) device that contains the optical assembly.

According to examples, a method of providing shock absorbers and supports between components of optical stacks in augmented reality (AR), virtual reality (VR) devices is described herein. A system of making the shock absorbers and supports between components of optical stacks in augmented reality (AR), virtual reality (VR) devices is also described herein. A non-transitory computer-readable storage medium may have an executable stored thereon, which when executed instructs a processor to perform the methods described herein.

In the foregoing description, various inventive examples are described, including devices, systems, methods, and the like. For the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples.

The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example' is not necessarily to be construed as preferred or advantageous over other embodiments or designs.

Although the methods and systems as described herein may be directed mainly to digital content, such as videos or interactive media, it should be appreciated that the methods and systems as described herein may be used for other types of content or scenarios as well. Other applications or uses of the methods and systems as described herein may also include social networking, marketing, content-based recommendation engines, and/or other types of knowledge or data-driven systems.

The invention claimed is:

1. An optical assembly, comprising:
   a first optical component and a second optical component, wherein the first optical component and the second optical component are layered in the optical assembly;
   a waveguide positioned between the first optical component and the second optical component;
   at least one first shock absorber positioned on a surface of the first optical component facing the waveguide; and
   at least one second shock absorber positioned on a surface of the second optical component facing the waveguide.

2. The optical assembly of claim 1, wherein at least one of the at least one first shock absorber and the at least one second shock absorber comprises:
   a support that touches a surface of the waveguide; or
   a stand-off that extends toward the waveguide with a gap between the stand-off and the surface of the waveguide.

3. The optical assembly of claim 2, wherein the gap is at least 2 micrometers.

4. The optical assembly of claim 1, wherein the at least one first shock absorber is positioned randomly on the surface of the first optical component; or
   wherein the at least one second shock absorber is positioned randomly on the surface of the second optical component.

5. The optical assembly of claim 1, wherein the at least one first shock absorber is positioned according to a predefined pattern on the surface of the first optical component; or
   wherein the at least one second shock absorber is positioned according to a predefined pattern on the surface of the second optical component.

6. The optical assembly of claim 1, wherein at least one of the at least one first shock absorber and the at least one second shock absorber comprises a pillar, a cone, an inverted cone, an inverted pillar, a spring, a double helix, a three-dimensional mesh, a strap, a bumper, a sphere, or a high aspect ratio 3D mesh tower.

7. The optical assembly of claim 1, wherein a height of at least one of the at least one first shock absorber and the at least one second shock absorber is in a range from 1 micrometer to 300 micrometers.

8. The optical assembly of claim 1, wherein at least one of the at least one first shock absorber and the at least one second shock absorber is made from a transparent or semi-transparent material with a refractive index in a range from 1.1 to 1.7.

9. The optical assembly of claim 1, further comprising:
   at least one third shock absorber positioned on a surface of a third optical component non-adjacent to the waveguide.

10. The optical assembly of claim 1, further comprising:
    one or more optical, electrical, or opto-electrical components layered in the optical assembly.

11. The optical assembly of claim 10, wherein the one or more optical, electrical, or opto-electrical components comprise one or more of free-form phase plate, a zoom focus lens, a liquid lens, a metalens, a light field lens, a solid optical lens, a microlens array, a diffractive or a transparent display.

12. A head-mounted display (HMD) device, comprising:
    a body; and
    an optical assembly within the body, the optical assembly comprising:
       a first component and a second component, wherein the first optical component and the second optical component are layered in the optical assembly;
       a waveguide positioned between the first component and the second component;
       at least one first shock absorber positioned on a surface of the first component facing the waveguide; and
       at least one second shock absorber positioned on a surface of the second component facing the waveguide.

13. The (HMD) device of claim 12, wherein at least one of the first component and the second component comprises:
an optical component, an electrical component, or an opto-electrical component.

14. The HMD device of claim 12, wherein at least one of the at least one first shock absorber and the at least one second shock absorber comprises:
a support that touches a surface of the waveguide; or
a stand-off that extends toward the waveguide with a gap between the stand-off and the surface of the waveguide.

15. The HMD device of claim 12, wherein
a height of at least one of the at least one first shock absorber and the at least one second shock absorber is in a range from 1 micrometer to 300 micrometers, and
a base diameter of at least one of the at least one first shock absorber and the at least one second shock absorber is in a range from 1 micrometer to 300 micrometers.

16. The HMD device of claim 12, wherein at least one of the at least one first shock absorber and the at least one second shock absorber is made from a transparent or semi-transparent material with a refractive index in a range from 1.1 to 1.7.

17. The HMD device of claim 12, wherein at least one of the at least one first shock absorber and the at least one second shock absorber comprises a pillar, a cone, an inverted cone, an inverted pillar, a spring, a double helix, a three-dimensional mesh, a strap, a bumper, a sphere, or a high aspect ratio 3D mesh tower.

18. A method comprising:
selecting a first optical component to be layered with one or more other components in an optical assembly, wherein a first surface of the first optical component is to face a first surface of a waveguide;
selecting a second optical component to be layered with the one or more other components in the optical assembly, wherein a first surface of the second optical component is to face a second surface of the waveguide;
fabricating, through lithography, at least one first shock absorber positioned on the first surface of the first optical component;
fabricating, through lithography, at least one other second shock absorber positioned on the first surface of the second optical component; and
assembling the first optical component, the second optical component, and the waveguide.

19. The method of claim 18, wherein fabricating, through lithography, the at least one first shock absorber comprises:
employing two-photon lithography.

20. The method of claim 18, wherein fabricating, through lithography, the at least one first shock absorber comprises:
fabricating one or more of a pillar, a cone, an inverted cone, an inverted pillar, a spring, a double helix, a three-dimensional mesh, a strap, a bumper, a sphere, or a high aspect ratio 3D mesh tower.

* * * * *